US007079352B1

(12) United States Patent  (10) Patent No.: US 7,079,352 B1
Soeda  (45) Date of Patent: Jul. 18, 2006

(54) MAGNETIC DISK APPARATUS WITH SEPARATE PRINTED-CIRCUIT BOARDS

(75) Inventor: Naoki Soeda, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/502,454

(22) Filed: Feb. 11, 2000

(30) Foreign Application Priority Data

Feb. 12, 1999 (JP) .............................. 1999/034726

(51) Int. Cl.
*G11B 5/012* (2006.01)
(52) U.S. Cl. .................................. 360/97.01
(58) Field of Classification Search ............ 360/97.01, 360/90, 93, 99.01, 99.06, 324.12; 361/685, 361/383; 369/75.1, 76; 84/454; 710/261; 711/114
See application file for complete search history.

(56) References Cited

U.S. PATENT DOCUMENTS

| 5,282,099 A * | 1/1994 | Kawagoe et al. ............ 360/900 |
| 5,487,160 A * | 1/1996 | Bemis ......................... 711/114 |
| 5,817,963 A * | 10/1998 | Fravel et al. ................. 84/454 |
| 6,094,325 A * | 7/2000 | Tagawa et al. ........ 360/324.12 |
| 6,307,743 B1 * | 10/2001 | Aizawa et al. .............. 361/683 |
| 6,421,754 B1 * | 7/2002 | Kau et al. .................... 710/261 |

FOREIGN PATENT DOCUMENTS

| JP | 60-109090 | 6/1985 |
| JP | 5-81846 | 4/1993 |
| JP | 05081846 A * | 4/1993 |
| JP | 7-176168 | 7/1995 |
| JP | 9-45070 | 2/1997 |

OTHER PUBLICATIONS

Japanese Office Action dated Sep. 5, 2001 with partial English translation.
Japanese Office Action dated Mar. 1, 2001, with partial English translation.

* cited by examiner

*Primary Examiner*—Tianjie Chen
(74) *Attorney, Agent, or Firm*—McGinn IP Law Group, PLLC

(57) ABSTRACT

Disclosed is a magnetic disk apparatus comprising: a disk enclosure; a first printed-circuit board which is paired with the disk enclosure; and a second printed-circuit board which is connected to the first printed circuit board via a cable and is separated from the first printed-circuit board in structure; wherein the first printed-circuit board mounts circuits which are poor in noise resistance property, and a circuit which holds parameters unique to the disk enclosure; and wherein the second printed circuit board mounts circuits which are superior in noise resistance property.

10 Claims, 5 Drawing Sheets

MAGNETIC DISK APPARATUS WITH SEPARATE PRINTED-CIRCUIT BOARDS

BACKGROUND OF THE INVENTION

1. Field of the Invention

The present invention relates to a magnetic disk apparatus and in particular, to the magnetic disk apparatus reduced in costs with miniaturized and diversified printed-circuit boards.

2. Description of the Prior Art

A conventional magnetic disk apparatus generally has a single printed-circuit board for a single disk enclosure. The single printed-circuit board mounts all the circuits for controlling the disk enclosure.

In case of exchanging a conventional magnetic disk apparatus to another conventional magnetic disk apparatus for the purpose of increasing the capacity of the magnetic disk apparatus constituting a system or preserving the former magnetic disk apparatus as a spare magnetic disk apparatus, the printed-circuit board as well as the disk enclosure are exchanged for another set, because the printed circuit board and the disk enclosure are incorporated in one.

Referring to FIG. 5, disk enclosure 82 comprises a storage medium (not shown), a spindle motor (not shown) for rotating the storage medium, a voice coil motor (not shown) for driving a magnetic head (not shown) and rotating an actuator (not shown), a carriage (not shown) for carrying the magnetic head, a base (not shown) for mounting the storage medium, and a recording/reproduced signal compensation circuit (not shown) for processing a record/reproduced signal to/from the magnetic head. The magnetic head is mounted on the carriage.

Recording/reproduction of a signal to/from the storage medium is performed by the recording/reproduced signal compensation circuit and the magnetic head under the control of recording/reproducing control circuit 83 mounted on printed-circuit board 81. SPM/VCM (Spindle Motor/Voice Coil Motor) control circuit 88 controls the rotation of the storage medium through the spindle motor and the position of the magnetic head through the voice coil motor. Interface control circuit 87 controls communication protocols with upper system 90 which are exchanged through connectors 89 and 91 and a bus cable therebetween. Parameter-holding circuit 86 holds parameters of the storage medium which correspond to a type of recording system and is such as a ROM. Analog/digital converter 84 converts an analog signal reproduced from the storage medium into a digital signal. Processor 85 controls recording/reproducing control circuit 83, parameter-holding circuit 86, interface control circuit 87, and SPM/VCM control 88.

As explained above, the conventional magnetic disk apparatus has a single printed-circuit board for a single disk enclosure. Therefore, in case of exchanging a conventional magnetic disk apparatus to another conventional magnetic disk apparatus, it is inevitable to exchange a printed-circuit board which is originally needless to be exchanged in addition to a disk enclosure, which results in an increase in cost of the exchange.

In case of a removable medium, after purchasing one removable medium and a recording/reproduction device, it is needed to purchase only another removable medium to increase the capacity. Therefore, the removable medium has a merit in capacity/cost ratio. On the other hand, in case of a magnetic disk apparatus, it is needed to purchase not only a disk enclosure but also a printed-circuit board which is unrelated to the increase of the capacity to increase the capacity.

In addition, the structure of a conventional disk apparatus in which a single printed-circuit board mounting all the circuits is combined with a single disk enclosure is a factor which prevents miniaturization of the apparatus and a breakaway of the apparatus from form factors.

SUMMARY OF THE INVENTION

In order to overcome the aforementioned disadvantages, the present invention has been made and accordingly, has an object to reduce the unit cost of a magnetic disk apparatus by dividing a printed-circuit board into function blocks and mounting only a circuit for holding parameters unique to a disk enclosure and circuits which are poor in noise resistance property on the printed-circuit board which is combined with the disk enclosure.

The present invention has another object to miniaturize a magnetic disk apparatus and to provide a form of the magnetic disk apparatus which is not restricted by form factors.

According to an aspect of the present invention, there is provided a magnetic disk apparatus comprising: a disk enclosure; a first printed-circuit board which is paired with the disk enclosure; and a second printed-circuit board which is connected to the first printed circuit board via a cable and is separated in structure from the first printed-circuit board; wherein the first printed-circuit board mounts circuits which are poor in noise resistance property, and a circuit which holds parameters unique to the disk enclosure; and wherein the second printed circuit board mounts circuits which are superior in noise resistance property.

The circuits which are poor in noise resistance property may include recording/reproduction control circuit.

The circuits which are poor in nose resistance property may include an analog/digital converter.

The circuits which are superior in noise resistance property may include an interface control circuit with an upper system.

The circuits which are superior in noise resistance property may include a processor.

The circuits which are superior in noise resistance property may include a spindle motor/voice coil motor control circuit.

The first printed-circuit board may further mount a elastomer connector.

The circuits which are superior in noise resistance property may include plural spindle motor/voice coil motor control circuits.

The circuits which are superior in noise resistance property may further include a single processor.

The circuits which are superior in noise resistance property may further include an interface circuit with an upper system.

The circuits which are superior in noise resistance property may further include a switch for selecting either of a first group consisting of a disk enclosure and a first printed-circuit board and a second group consisting of another disk enclosure and another first printed-circuit board.

The second printed-circuit board may be separated into a third printed circuit board and a fourth printed circuit; wherein the third printed circuit board may mount the interface control circuit; and wherein the fourth printed circuit board may mount the circuits which are superior in noise resistance property other than the interface control circuit.

The second printed-circuit board may not mount an interface control circuit.

The circuits which are superior in noise resistance property may include a processor.

The circuits which are superior in noise resistance property may include a spindle motor/voice coil motor control circuit.

These and other objects, features and advantages of the present invention will become more apparent in the light of the following detailed description of the best mode embodiments thereof, as illustrated in the accompanying drawings.

DETAILED DESCRIPTION OF THE PREFERRED EMBODIMENT

Preferred modes of embodiment according to the present invention will be described with reference to the accompanying drawings.

Embodiment 1

Figure 1:
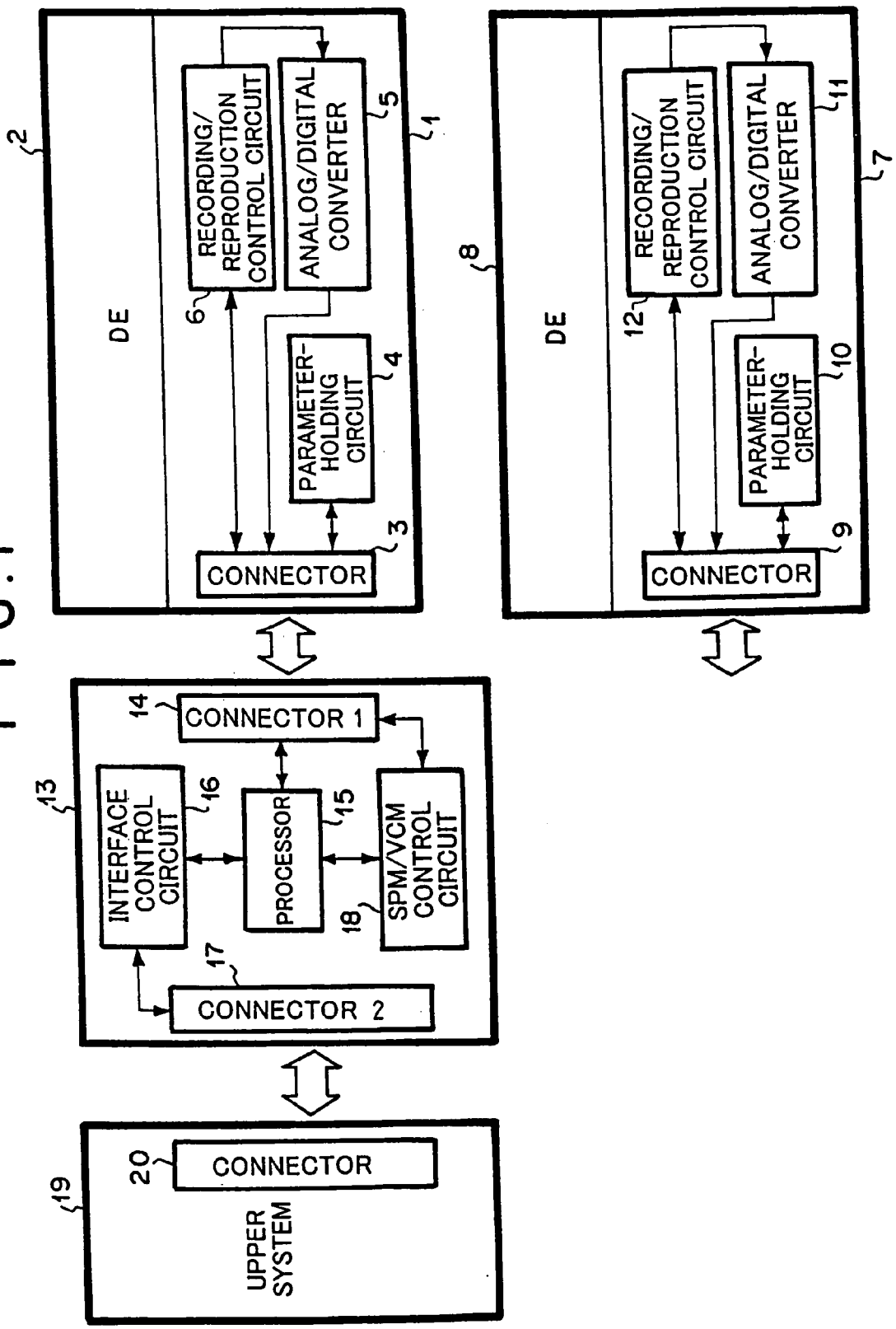
FIG. 1 is a block diagram showing the structure of a magnetic disk apparatus according to a first embodiment of the present invention.

Referring to FIG. 1, printed-circuit board 1 is combined with disk enclosure 2 in one-to-one relation.

Printed-circuit board 1 mounts connector 3, parameter-holding circuit 4, analog/digital converter 5, and recording/reproduction circuit 6. Connector 3 is coupled with connector 14 on printed-circuit board 13. Parameter-holding circuit 4 holds parameters unique to disk enclosure 2. Analog/digital converter 5 and recording/reproduction control circuit 6 are poor in noise resistance property. The functions of analog/digital converter 5 and recording/reproduction control circuit 6 are the same as those of analog/digital converter 84 and recording/reproduction control circuit 83, respectively.

Printed circuit board 13 mounts connector 14, processor 15, interface control circuit 16, connector 17, and SPM/VCM control circuit 18. The functions of processor 15, interface control circuit 16, connector 17, and SPM/VCM control circuit 18 are the same as those of processor 85, interface control circuit 87, connector 89, and SPM/VCM control circuit 88, respectively. Processor 15, interface control circuit 16, and SPM/VCM control circuit 18 are superior in noise resistance property.

Recording/reproduction circuit 6 is located in the neighbor of a magnetic head to prevent mixture of noise coming from the external into a reproduced signal because the reproduced signal is low in level and high in frequency.

Parameter-holding circuit 4 holds parameters which are unique to disk enclosure 2 such as the number of disks, the material of the disks, the speed of revolution of the disks, the number of tracks per disk, and track pitch of the disks.

Interface control circuit 16 is in conformity with IDE (Integrated Device Electronics), SCSI (Small Computer Systems Interface) or the like, and is not preferably restricted by types of upper system 19.

Disk enclosure 2 comprises a storage medium (not shown), a spindle motor (not shown) for rotating the storage medium, a voice coil motor (not shown) for driving a magnetic head (not shown) and rotating an actuator (not shown), a carriage (not shown) for carrying the magnetic head, a base (not shown) for mounting the storage medium, and a recording/reproduced signal compensation circuit (not shown) for processing a record/reproduced signal to/from the magnetic head. The magnetic head is mounted on the carriage.

Recording/reproduction of a signal to/from the storage medium is performed by the recording/reproduced signal compensation circuit and the magnetic head under the control of recording/reproducing control circuit 6 mounted on printed-circuit board 1. SPM/VCM control circuit 18 controls the rotation of the storage medium through the spindle motor and the position of the magnetic head through the voice coil motor. Interface control circuit 16 controls communication protocols with upper system 19 which are exchanged through connectors 17 and 20 and a bus cable therebetween. Upper system 19 outputs the data to be recorded in disk enclosure 2 and inputs the data reproduced from disk enclosure 2. Processor 15 controls recording/reproducing control circuit 6, parameter-holding circuit 4, interface control circuit 13, and SPM/VCM control 18.

Because of the structure of the magnetic disk apparatus of this embodiment, in case of exchanging a magnetic disk apparatus of this embodiment to another magnetic disk apparatus of this embodiment, it is needless to exchange printed-circuit board 13 and it is only needed to exchange the set of printed-circuit board 1 and disk enclosure 2 to the set of printed-circuit board 7 and disk enclosure 8. Therefore, the cost of the exchange is reduce by the cost of printed-circuit board 13 as compared with the conventional magnetic disk apparatus. In addition, the exchangeable part of the magnetic disk apparatus of this embodiment is miniaturized by the size of printed-circuit board 13 owing to the structure of the magnetic disk apparatus of this embodiment. Further, because parameter-holding circuit 4 and 10 hold parameters unique to disk enclosure 2 and 8, respectively, and connectors 3 and 9 are elastomer connectors for easy attachment/detachment, the set of printed-circuit 1 and disk enclosure 2 can be easily exchanged to the set of printed circuit 7 and disk enclosure 8. Still further, the forms of printed-circuit boards 1, 7, 13 are not restricted by form factors and free from old-fashioned forms.

Embodiment 2

The second embodiment is basically the same as the first embodiment, but more improved in a method of dividing printed-circuit boards than the first embodiment.

Figure 2:
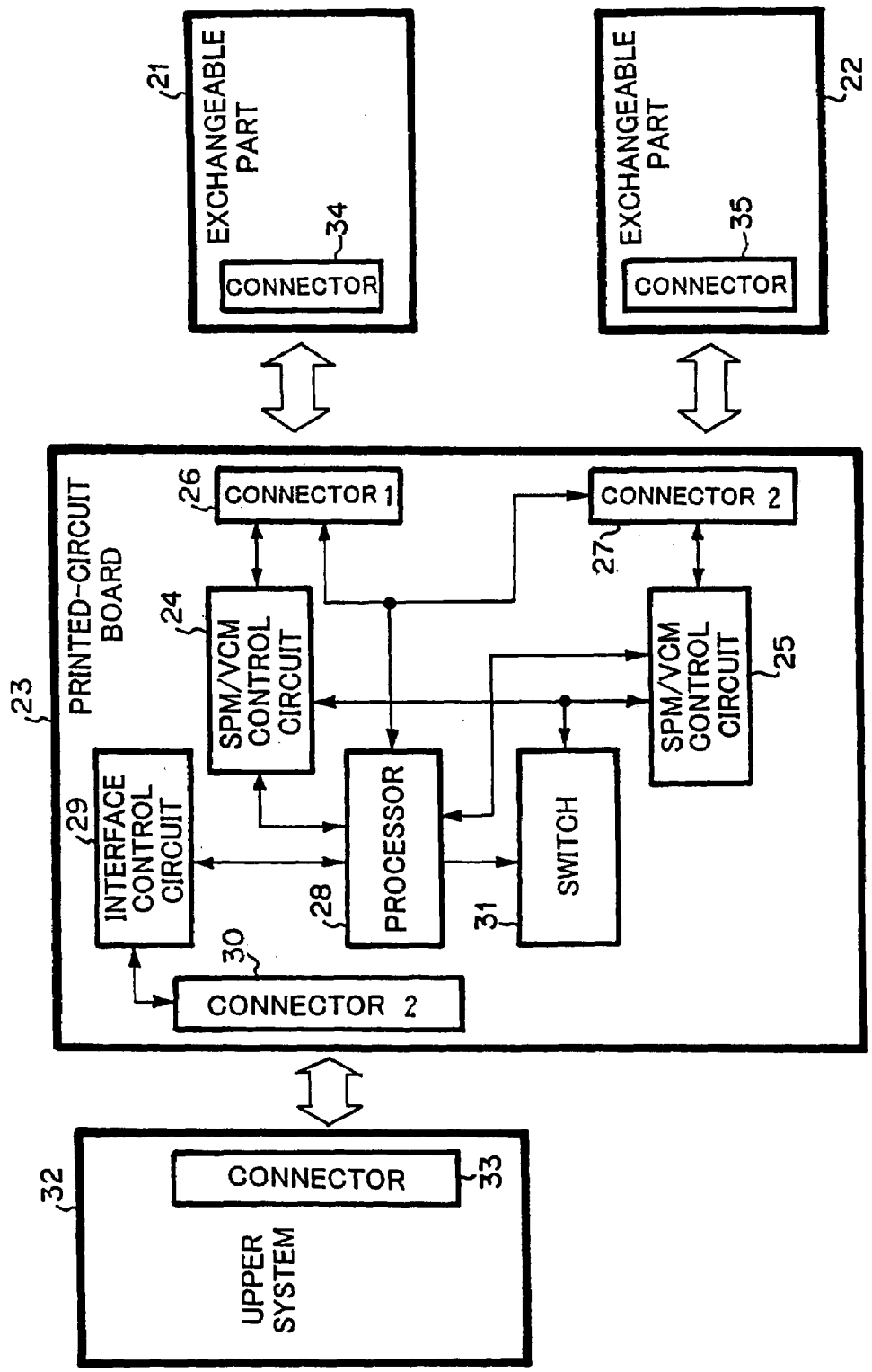
FIG. 2 is a block diagram showing the structure of a magnetic disk apparatus according to a second embodiment of the present invention.

Referring to FIG. 2, printed-circuit board mounts SPM/VCM control circuit 24 and 25, connectors 26, 27, processor 28, interface control circuit 29, connector 30, and switch circuit 31. Each of exchangeable part 21 and 22 is composed of a disk enclosure, a board mounting a connector 34 or 35, a parameter-holding circuit, an analog/digital converter, writing/reproduction control circuit 6. Exchangeable part 21 is the same as a set of printed-circuit board 1 mounting the aforementioned parts and disk enclosure 2, and exchangeable part 22 is the same as a set of printed-circuit 7 mounting the aforementioned parts and disk enclosure 8. One processor 28 and one interface control circuit 29 correspond to two exchangeable parts 21 and 22.

SPM/VCM control circuits 24 and 25 perform spindle motor control and voice coil motor control for exchangeable parts 21 and 25, respectively. Switch 31 determines which of exchangeable parts 21 and 22 is selected. This embodiment has a configuration in which two SPM/VCM control circuit 24 and 25 and two connectors 26 and 27 are included. This configuration enables a single processor 28 to control two exchangeable parts 21 and 22, whereby a capacity/cost ratio is improved.

Embodiment 3

A conventional magnetic disk apparatus consisting of a set of a disk enclosure and a single printed-circuit board is not compatible with plural types of interface format with an upper system. Therefore, if a type of interface format changes to another type of interface format, the whole of conventional magnetic disk apparatus must be exchanged to another conventional magnetic disk apparatus. This embodiment dissolves this disadvantage.

Figure 3:
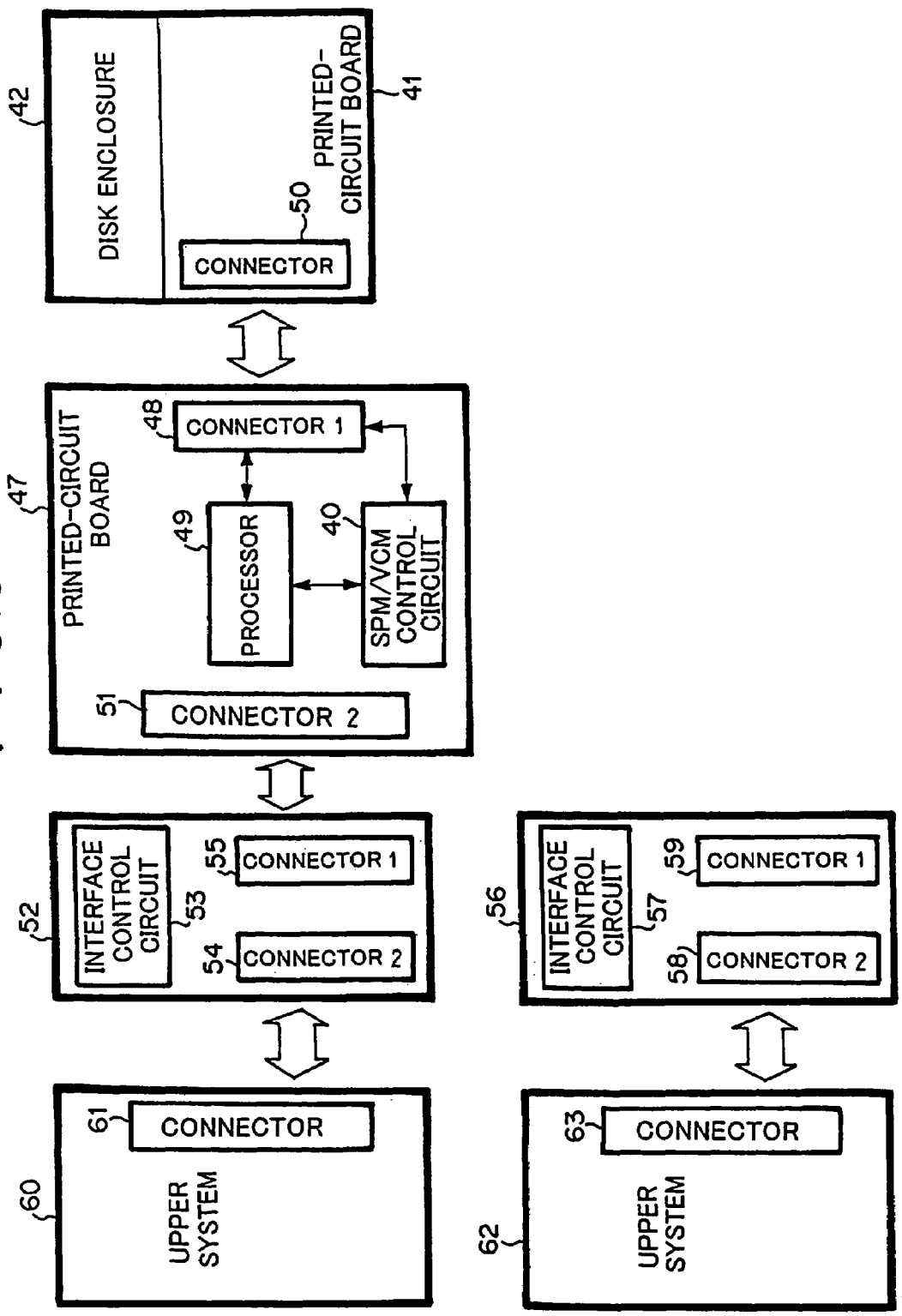
FIG. 3 is a block diagram showing the structure of a magnetic disk apparatus according to a third embodiment of the present invention.

Referring to FIG. 3, a magnetic disk apparatus of this embodiment comprises disk enclosure 42, and printed-circuit boards 41, 47, and 52 or 56. Printed-circuit board 41 mounts connector 50, a parameter-holding circuit, an analog/digital converter, and recording/reproduction control circuit. Printed-circuit board 47 mounts connectors 48 and 51, SPM/VCM control circuit 40, and processor 49. Printed-circuit board 52 mounts connectors 54 and 55, and interface control circuit 53. Printed-circuit board 56 mounts connectors 58 and 59, and interface control circuit 57.

Interface control circuit 53 and connector 54 are in conformity with an interface with upper system 60. Interface control circuit 57 and connector 58 are in conformity with an interface with upper system 62. Interface control circuit 53 controls the communication protocol with upper system 60 and interface control circuit 57 controls the communication protocol with upper system 62.

When connecting a magnetic disk apparatus which consists of disk enclosure 42 and printed-circuit board 41, 47, and 52 and is connected to upper system 60 to upper system 62 which has an interface different from that of upper system 60, it is needless to exchange disk enclosure 42 and printed-circuit board 41 and 47 and it is only needed to exchange printed-circuit board 52 to printed-circuit board 56.

Embodiment 4

Figure 4:
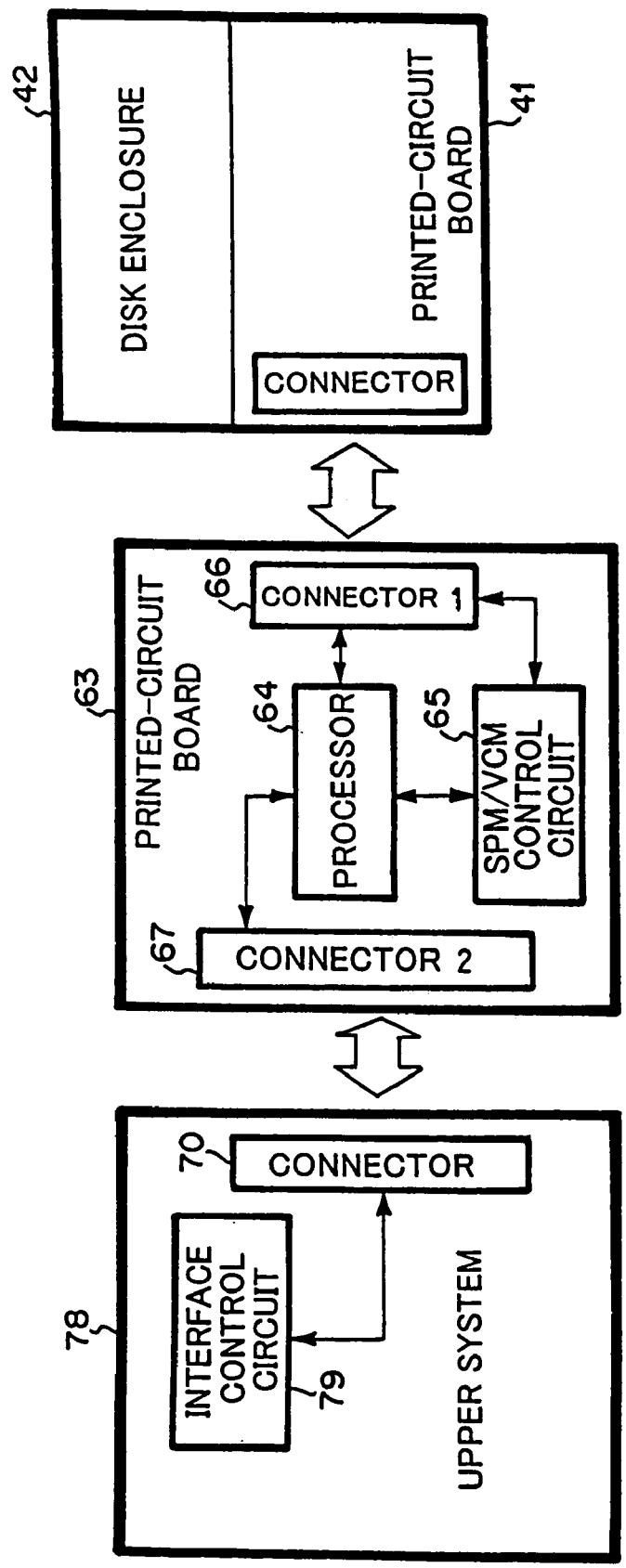
FIG. 4 is a block diagram showing the structure of a magnetic disk apparatus according to a fourth embodiment of the present invention.
Figure 5:
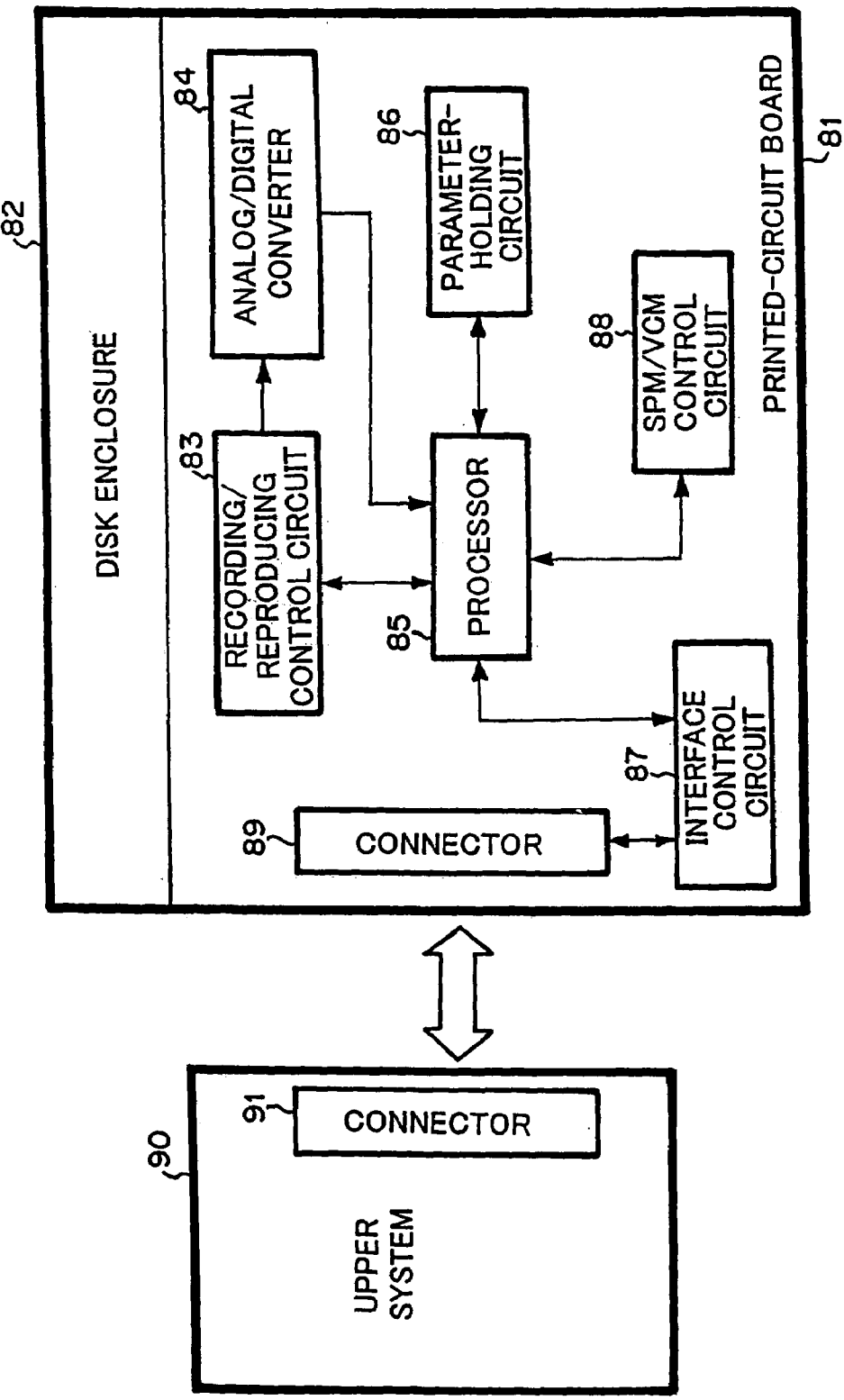
FIG. 5 is a block diagram showing the structure of a conventional magnetic disk apparatus.

Referring to FIG. 4, a magnetic disk apparatus of this embodiment comprises disk enclosure 42, printed-circuit board 41, and printed-circuit board 63. Disk enclosure is the same as disk enclosure 2. Printed-circuit board 41 is the same as printed-circuit board 1 and mounts a connector, a parameter-holding circuit, an analog/digital converter and recording/reproduction control circuit. Interface control circuit 79 is not mounted on printed-circuit board 63 but is incorporated in upper system 79.

The operations of the analog/digital converter mounted on printed-circuit board 41, the recording/reproduction control circuit mounted on printed-circuit board 41, processor 64, SPM/VCM control circuit 65, interface control circuit 79 are the same as those of analog/digital converter 5, recording/reproduction control circuit 6, processor 15, SPM/VCM control circuit 18, and interface control circuit 16, respectively, and explanations thereof are omitted.

Because interface control circuit 79 is incorporated in upper system 78, the cost of the magnetic disk apparatus is reduced and the magnetic disk apparatus is miniaturized.

As explained above, according to the present invention, the cost of the magnetic disk apparatus is reduced, the magnetic disk apparatus is miniaturized, and the form of the magnetic disk apparatus is not restricted by form factors because of a basic structure in which a printed-circuit board is divided into function blocks.

In addition, the interface with an upper system can be easily changed because an interface circuit is separated.

Further, the magnetic disk apparatus can be easily exchanged to another one because a non-volatile memory is used for a parameter-holding circuit which holds parameters unique to a disk enclosure and an elastomer connector is used for a connector which connects printed-circuit boards together.

Although the present invention has been shown and explained with respect to the best mode embodiments thereof, it should be understood by those skilled in the art that the foregoing and various other changes, omissions, and additions in the form and detail thereof may be made therein without departing from the spirit and scope of the present invention.

What is claimed is:

1. A magnetic disk apparatus comprising:
   a plurality of disk enclosures;
   a plurality of first printed-circuit boards which are paired with said respective disk enclosures; and
   a second printed-circuit board which is detachably connected to said plurality of first printed-circuit boards;
   wherein each of said plurality of first printed-circuit boards mounts circuits which have a first noise resistance property, and a circuit which holds parameters unique to a corresponding disk enclosure;
   wherein said second printed-circuit board mounts circuits which have a second noise resistance property which is superior to said first noise resistance property,
   wherein said circuits on said second printed-circuit board include a switch for selecting either of one of said plurality of first printed-circuit boards simultaneously connected to a processor on said second printed-circuit board and another of said plurality of first printed-circuit boards simultaneously connected to said processor on said second printed-circuit board,
   wherein said second printed circuit board is detachably connectable to an upper system, and
   wherein said circuits on each of said plurality of first printed-circuit boards comprise a recording/reproduction control circuit.

2. The magnetic disk apparatus of claim 1, wherein said circuits on each of said plurality of first printed-circuit boards comprise an analog/digital converter.

3. The magnetic disk apparatus of claim 1, wherein said circuits on said second printed-circuit board comprise a spindle motor/voice coil motor control circuit.

4. The magnetic disk apparatus of claim 1, wherein each of said plurality of first printed-circuit boards further mounts an elastomer connector.

5. The magnetic disk apparatus of claim 1, wherein said circuits on said second printed-circuit board comprise plural spindle motor/voice coil motor control circuits each of which corresponds to each of said plurality of first printed-circuit boards.

6. The magnetic disk apparatus of claim 5, wherein said circuits on said second printed-circuit board further comprise said single processor.

7. The magnetic disk apparatus of claim 5, wherein said circuits on said second printed-circuit board further comprise an interface circuit with an upper system.

8. The magnetic disk apparatus of claim 1,
wherein said circuits on said second printed-circuit board are separated into a third printed circuit board and a fourth printed circuit board;
wherein said third printed circuit board mounts an interface control circuit; and
wherein said fourth printed circuit board mounts said circuits other than said interface control circuit.

9. The apparatus of claim 1, wherein said second printed-circuit board comprises at least one of a spindle motor driver and a voice coil motor control circuit having said second noise resistance property.

10. The apparatus of claim 9, wherein said recording/reproduction control circuit has said first noise resistance property.

* * * * *